US012155298B2

(12) United States Patent
Venca

(10) Patent No.: US 12,155,298 B2
(45) Date of Patent: Nov. 26, 2024

(54) AUTOMATCH IN OPEN LOOP

(71) Applicant: EM Microelectronic-Marin SA, Marin (CH)

(72) Inventor: Alessandro Venca, Hauterive (CH)

(73) Assignee: EM Microelectronic-Marin SA, Marin (CH)

( * ) Notice: Subject to any disclaimer, the term of this patent is extended or adjusted under 35 U.S.C. 154(b) by 280 days.

(21) Appl. No.: 17/774,476

(22) PCT Filed: Dec. 16, 2020

(86) PCT No.: PCT/EP2020/086554
§ 371 (c)(1),
(2) Date: May 4, 2022

(87) PCT Pub. No.: WO2021/089884
PCT Pub. Date: May 14, 2021

(65) Prior Publication Data
US 2022/0399798 A1 Dec. 15, 2022

(30) Foreign Application Priority Data

Nov. 5, 2019 (EP) .................................... 19207239
Jan. 29, 2020 (EP) .................................... 20154405
Nov. 5, 2020 (WO) ................. PCT/EP2020/081170

(51) Int. Cl.
*H02M 3/07* (2006.01)
*G11C 5/14* (2006.01)
(Continued)

(52) U.S. Cl.
CPC ............... *H02M 3/07* (2013.01); *G11C 5/145* (2013.01); *G11C 29/028* (2013.01);
(Continued)

(58) Field of Classification Search
CPC .... H02M 1/0012; H02M 1/0025; H02M 3/07; H02M 3/073
See application file for complete search history.

(56) References Cited

U.S. PATENT DOCUMENTS 6,658,239 B1* 12/2003 Elder .................. H04B 1/0458
455/121
2002/0132595 A1* 9/2002 Kokubo ................... H04B 1/04
455/127.5

(Continued)

OTHER PUBLICATIONS

International Search Report issued Mar. 4, 2021 in PCT/EP2020/086554, filed on Dec. 16, 2020, 3 pages.

*Primary Examiner* — Jue Zhang
*Assistant Examiner* — Lakaisha Jackson
(74) *Attorney, Agent, or Firm* — Oblon, McClelland, Maier & Neustadt, L.L.P.

(57) ABSTRACT

An open loop control unit is provided to monitor an output power of a charge pump converter having an input impedance and a first input impedance controlling terminal configured to be plugged to the open loop control unit and modify the input impedance. The open loop control unit includes at least a reference circuit to sense the output power of the charge pump converter and at least one control circuit to receive the difference value, establish a trim value, and send the trim value to the impedance controlling terminal so as to modify the input impedance.

13 Claims, 10 Drawing Sheets

(51) Int. Cl.
*G11C 29/02* (2006.01)
*G11C 29/50* (2006.01)
*H02M 1/00* (2006.01)

(52) U.S. Cl.
CPC ..... *G11C 29/50008* (2013.01); *H02M 1/0012* (2021.05); *H02M 1/0025* (2021.05); *H02M 3/073* (2013.01)

(56) References Cited

U.S. PATENT DOCUMENTS

| | | | | |
|---|---|---|---|---|
| 2010/0141347 | A1* | 6/2010 | Hsiao | H03L 7/18 331/17 |
| 2012/0293893 | A1 | 11/2012 | Sato | |
| 2019/0222119 | A1* | 7/2019 | Zhang | H02M 3/07 |

* cited by examiner

AUTOMATCH IN OPEN LOOP

TECHNICAL FIELD

The present invention relates to the field of open loop control unit and in particular of at least one open loop control unit for UHF RFID passive tags.

STATE OF THE ART

In general, in an RFID communication system, the receiving tag antenna may be adapted to maximize the received signal at a specific frequency, i.e. the tuning frequency $f_0$. The adaptation may be achieved for a specific antenna and tag input impedance.

In this adapted condition, the received power may be maximized, and the Mismatch Loss, ML for short, may be minimized.

Every time the input frequency signal carrier fc differs from $f_0$, or the tag or antenna impedances differ from the value needed to achieve adaptation the system suffers a loss in the received power.

In operative conditions, the above disrupting scenario may happen for the following reasons:
  The input signal frequency can operate at different frequencies in the UHF RFID band [860-960] MHz;
  Variations in electronic components values due to process or temperature may cause variation in the tag input impedance; and,
  Environmental conditions in which the tag operates, e.g. medium, humidity, temperature, may alter the antenna adaptation.

Therefore, there may be a need to maximize the tag reading distance and this independently of the operative conditions.

SUMMARY OF THE INVENTION

In order to achieve this objective, the present invention provides at least one open loop control unit configured to control the efficiency and/or the input impedance of a charge pump converter having an input impedance between a second primary signal input and a second secondary signal input, and an first input impedance controlling terminal configured to be plugged to said open loop control unit; said first input impedance controlling terminal may be configured to modify said input impedance; said open loop control unit comprising at least one:
  reference circuit: said at least reference circuit comprises at least one main reference configured to be constant over time and temperature, and at least one auxiliary reference configured to vary over time and temperature; said at least one reference circuit may be configured to sense difference between said at least one main reference and said at least one auxiliary reference such as to transmit a difference value as a function of the temperature and/or the time;
  control unit: said at least one control unit may be configured to receive said difference value, to establish a trim value and to send said trim value to said impedance controlling terminal such as to modify said input impedance.

Thus, this configuration allows determining the received power and take actions to minimize the tag sensitivity and thus maximize the tag reading distance.

According to an embodiment, said difference value comprises a voltage difference value and/or current difference value.

According to an embodiment, said voltage difference value and/or said current difference value may be or may be analog signal.

Thus, the transmission of said difference value as a function of the temperature and/or the time may be quicker than digital signal.

According to an embodiment, wherein said at least one auxiliary reference comprises at least one first switching element having first specifications and said charge pump converter comprises at least one primary switching element and at least one secondary switching element having second specifications; a ratio between said first specifications and said second specifications may be comprised between 0.8 and 1.25, preferably between 0.9 and 1.11.

According to an embodiment, said first specifications and said second specification may be configured to vary over time and temperature.

According to an embodiment, said at least one main reference may be configured to set a reference value and said at least one auxiliary reference may be configured to supply a variable value; said reference value may be constant over time and temperature and said variable value varies over time and temperature.

According to an embodiment, Open loop control unit according any preceding claims, wherein said at least one reference circuit comprises at least one at least one comparison circuit configured to compare said reference value to said variable value.

According to an embodiment, said at least control unit comprises at least one controller configured to establish an established voltage value and/or an established current value as a function of said difference between said at least one main reference and said at least one auxiliary reference.

According to an embodiment, said at least bias supplier comprises at least one converter configured to convert said difference between said at least one main reference and said at least one auxiliary reference into a digital voltage value and/or a digital current value.

The present invention provides at least one control system device comprising at least one open loop control unit according any preceding claims and at least one charge pump converter; said at least one charge pump converter comprising at least one primary gate controller and at least one secondary gate controller; said at least one primary gate controller comprises at least one;
  primary signal output: said at least one primary signal output is configured to be connected to an at least one second primary signal input of a charge pump converter stage and/or a first circuit;
  first primary signal input: said at least one first primary signal input is configured to receive a first control signal;
  primary bias input: said at least one primary bias input configured to establish a voltage value and/or a current value of said at least one primary gate controller;
  second primary signal input: said at least one second primary signal input configured to be connected to an at least one primary signal output of a charge pump converter stage and/or to receive said main signal, preferably from an antenna, from an integrated circuit, at least one primary signal and/or from a charge pump converter stage; and,
  said at least one secondary gate controller comprises at least one:

secondary signal output: said at least one secondary signal output is configured to be connected to an at least one second secondary signal input of a charge pump converter stage and/or a second circuit;

first secondary signal input: said at least one first secondary signal input is configured to receive a second control signal;

secondary bias input: at least one secondary bias input configured to establish a voltage value and/or a current value of said at least one secondary gate controller; and, second secondary signal input: said at least one second secondary signal input configured to be connected to an at least one secondary signal output of a charge pump converter stage and/or to receive a main signal, preferably from an antenna, from an integrated circuit, at least one secondary signal and/or from a charge pump converter stage;

said at least one first primary signal input is configured to be connected to said at least one secondary signal output and said at least one first secondary signal input is configured to be connected to said at least one primary signal output.

Thanks to the arrangement according to the invention, said control system device allows sensing the received power and take actions to minimize the tag sensitivity and thus maximize the tag reading distance by adjusting the bias voltage of the gate by coupling the gate of the switching element to the output of the previous charge pump converter stage and said at least one bias input, which sets the DC gate's voltage reference bias.

According to an embodiment, said at least one primary gate controller comprises at least one primary switching element having a primary conduction path with a first primary terminal and a second primary terminal, and a primary gate configured to control the current flowing through said primary conduction path, said primary conduction path being configured to provide said at least one primary signal; said primary gate is configured to be connected to said at least one first primary signal input and to said at least one primary bias input, and/or wherein said at least one secondary gate controller comprises at least one secondary switching element having a secondary conduction path with a first secondary terminal and a second secondary terminal, and a secondary gate configured to control the current flowing through said secondary conduction path, said secondary conduction path being configured to provide said at least one secondary signal; said secondary gate is configured to be connected to said at least one first secondary signal input and to said at least one secondary bias input.

Thanks to the arrangement according to the invention, the charge pump converter stage allows adjusting the bias voltage of the gate by coupling the gate of the switching element to the output of the previous charge pump converter stage and said at least one bias input, which sets the DC gate's voltage reference bias.

According to an embodiment, said at least one primary bias input comprises a plurality of primary bias current flow controller comprising at least one first primary bias current flow controller and/or at least one second primary bias transistor and/or wherein said at least one secondary bias input comprises a plurality of secondary bias current flow controller comprising at least one first secondary bias current flow controller and/or at least one second secondary bias transistor.

According to an embodiment, said at least one charge pump converter comprises at least one first input impedance controlling terminal configured to be plugged to said open loop control unit such as to modify said input impedance.

According to an embodiment, said at least one first input impedance controlling terminal is configured to control the current flowing through said primary conduction path or said secondary conduction path and preferably of said at least one first primary bias current flow controller said at least one second primary bias transistor, said at least one first secondary bias current flow controller and/or said at least one second secondary bias transistor.

Thanks to one of those arrangements according to the invention, the conduction path of the switching element may be controlled.

BRIEF DESCRIPTION OF THE DRAWINGS

The foregoing and other purposes, features, aspects and advantages of the invention will become apparent from the following detailed description of the embodiments, given by way of illustration and not limitation with reference to the accompanying drawings, in which.

DESCRIPTION OF THE INVENTION

Figure 1A:
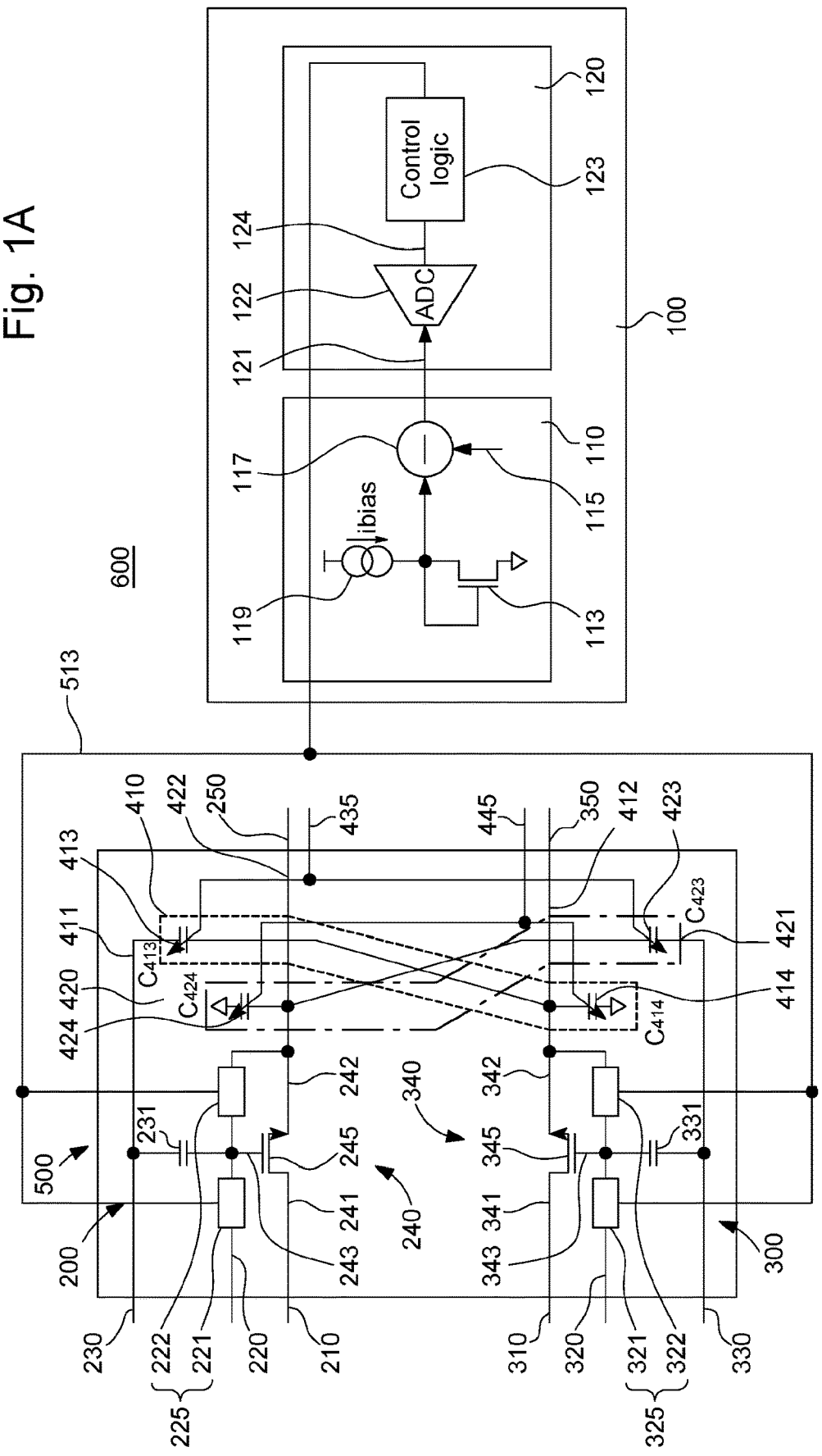
FIGS. 1A and 1B represent at least one open loop control unit 100 according to the invention.

The present invention relates to at least one open loop control unit 100 configured to determine the output power of a charge pump converter 500 such as to maximize the received signal at a specific frequency, i.e. the tuning frequency $f_0$.

Indeed, said open loop control unit 100 may be connected to a charge pump converter 500 or Programmable Self-Biased Gate Control 500, PSBGC 500 for short.

Said Programmable Self-Biased Gate Control 500 or PSBGC 500 may have an input impedance between a first input terminal 210 and a second input terminal 310, and a first output terminal 350, a second output terminal 250 and a first input impedance controlling terminal 513, as illustrated in FIG. 1.

Said first input impedance controlling terminal 513 may be configured to be plugged to said open loop control unit 100 and to modify said input impedance according a signal from said open loop control unit 100.

Figure 2:
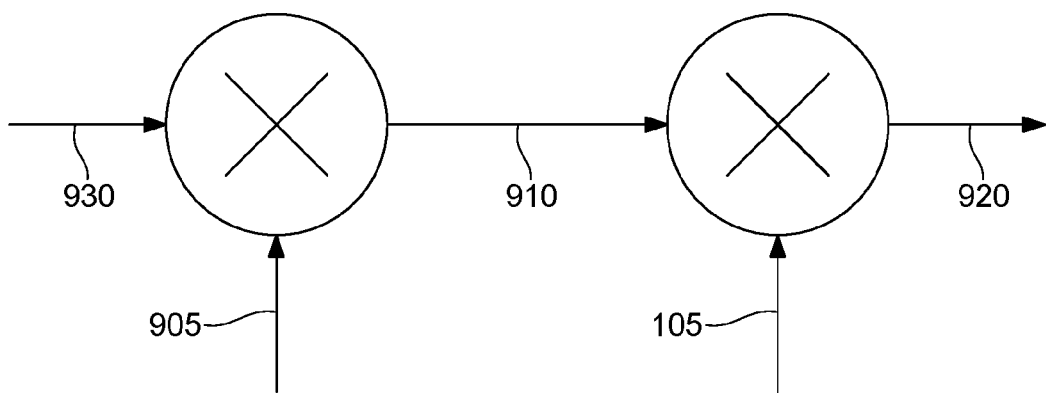
FIG. 2 shows a block diagram.
Figure 3:
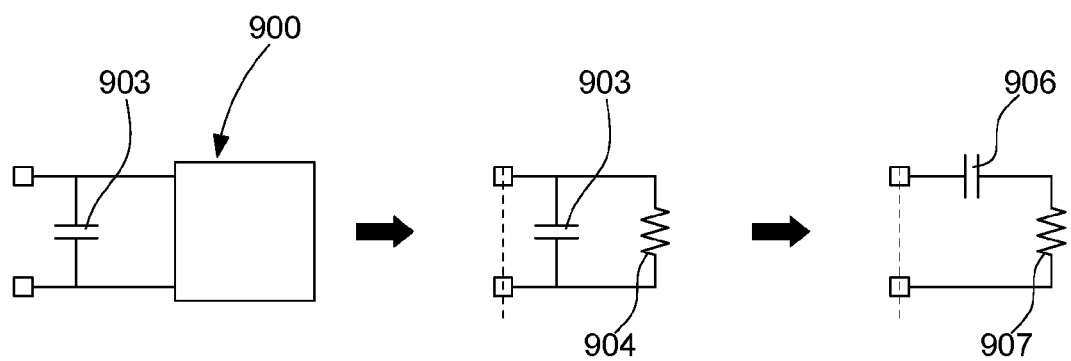
FIG. 3 illustrates a parallel equivalent circuit and a serie equivalent circuit of a charge pump converter 500.
Figure 4A:
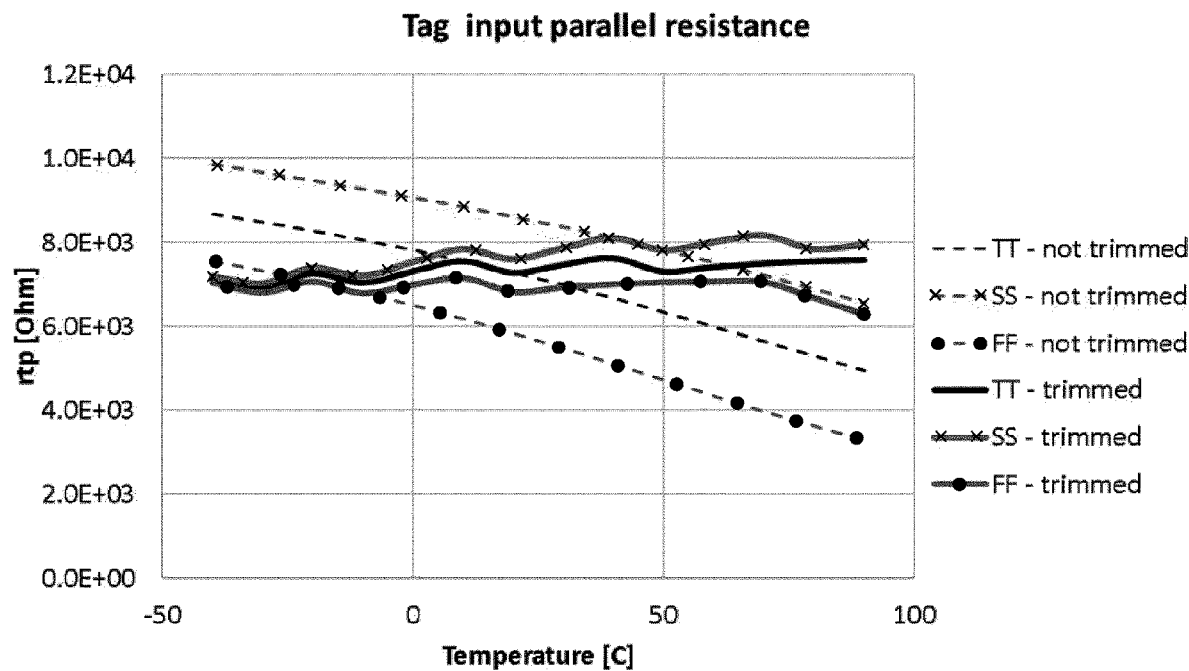
FIGS. 4A-4G represent a AutoMatch tag performances at $f_{in}=f_0$.
Figure 4B:
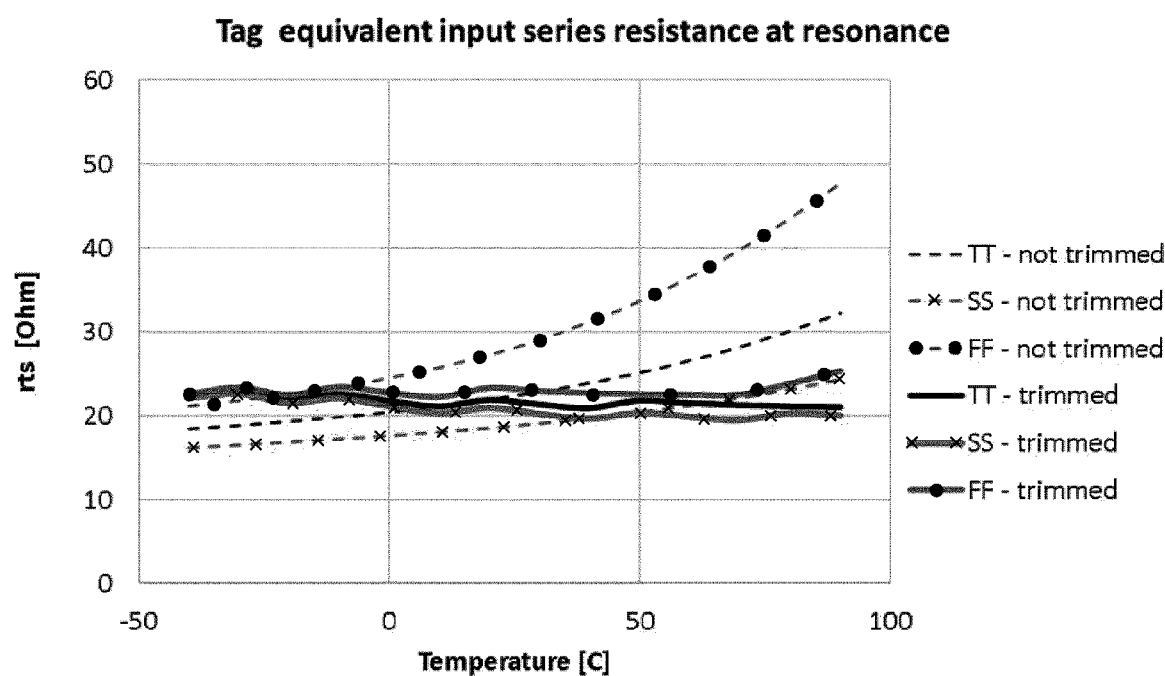
Figure 4C:
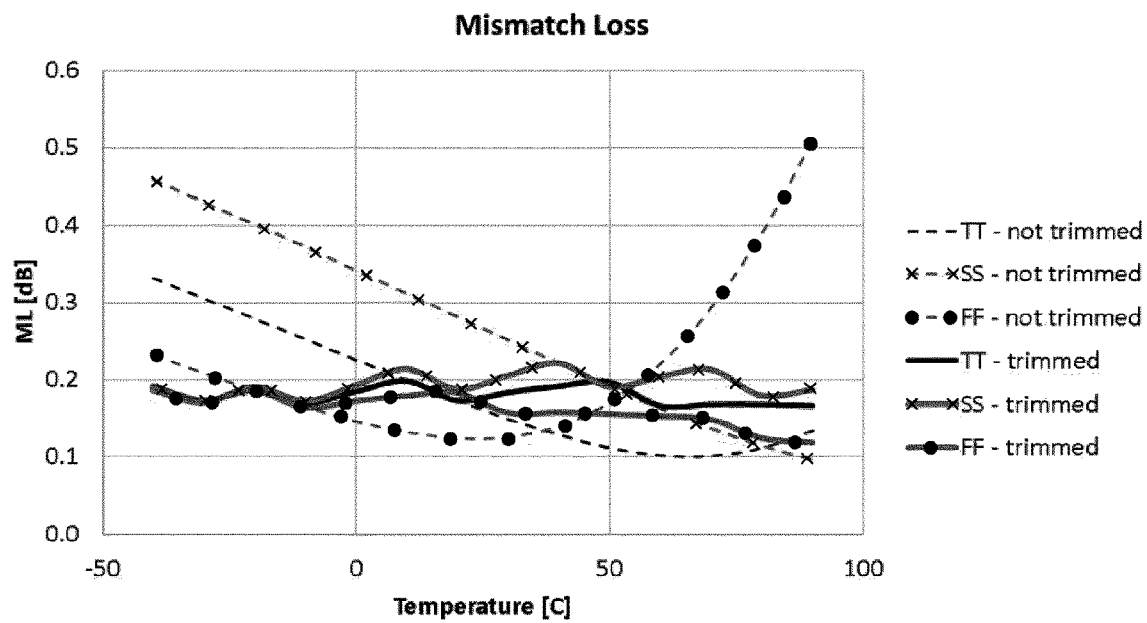
Figure 4D:
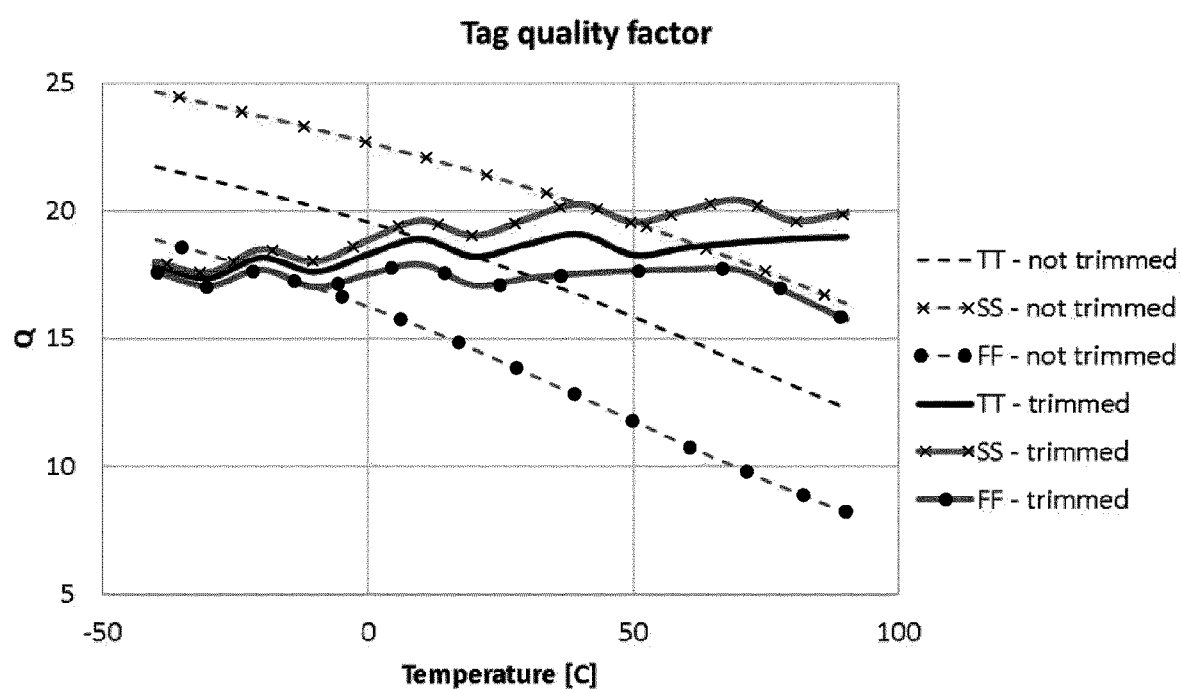
Figure 4E:
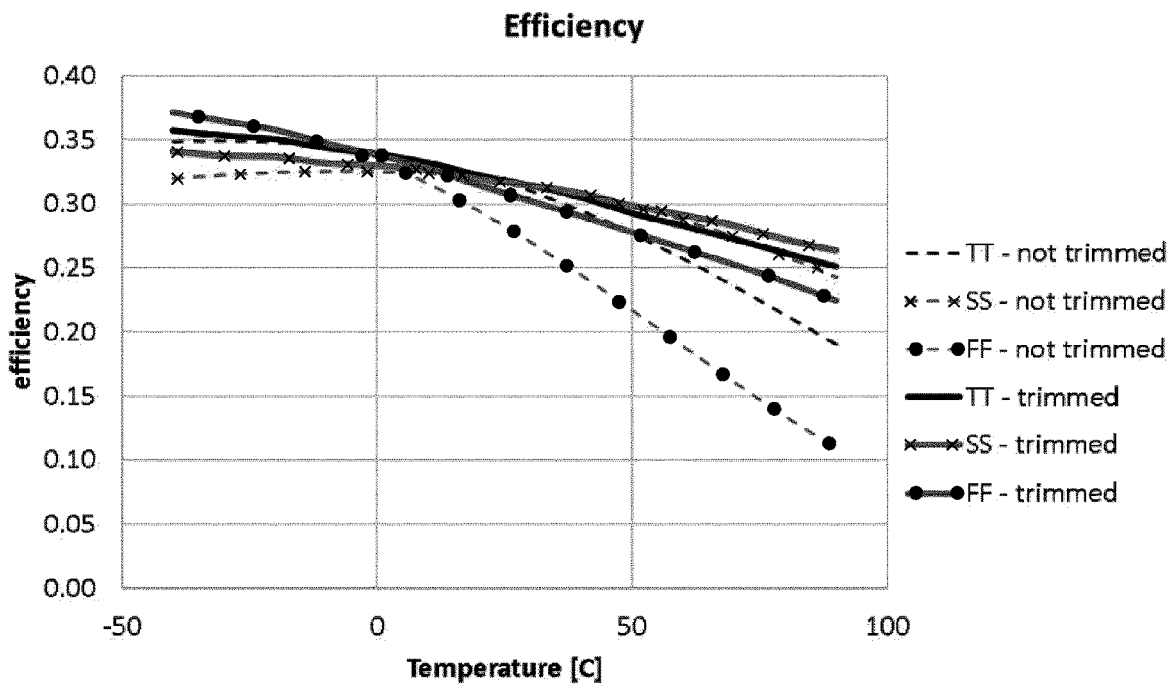
Figure 4F:
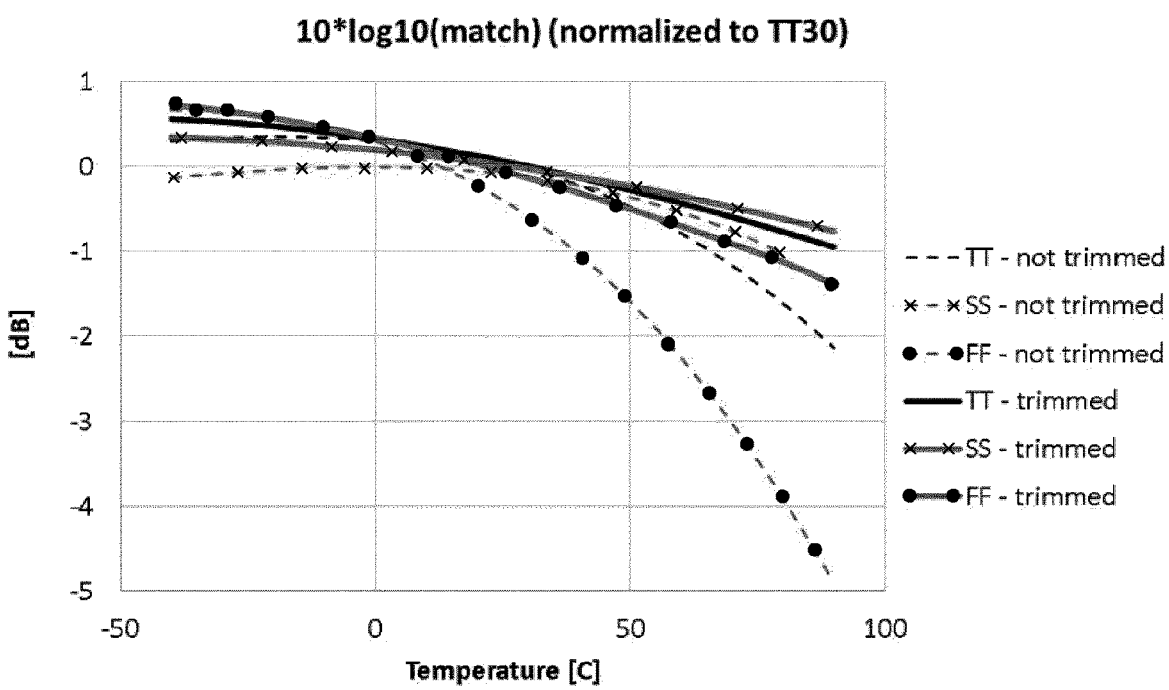
Figure 4G:
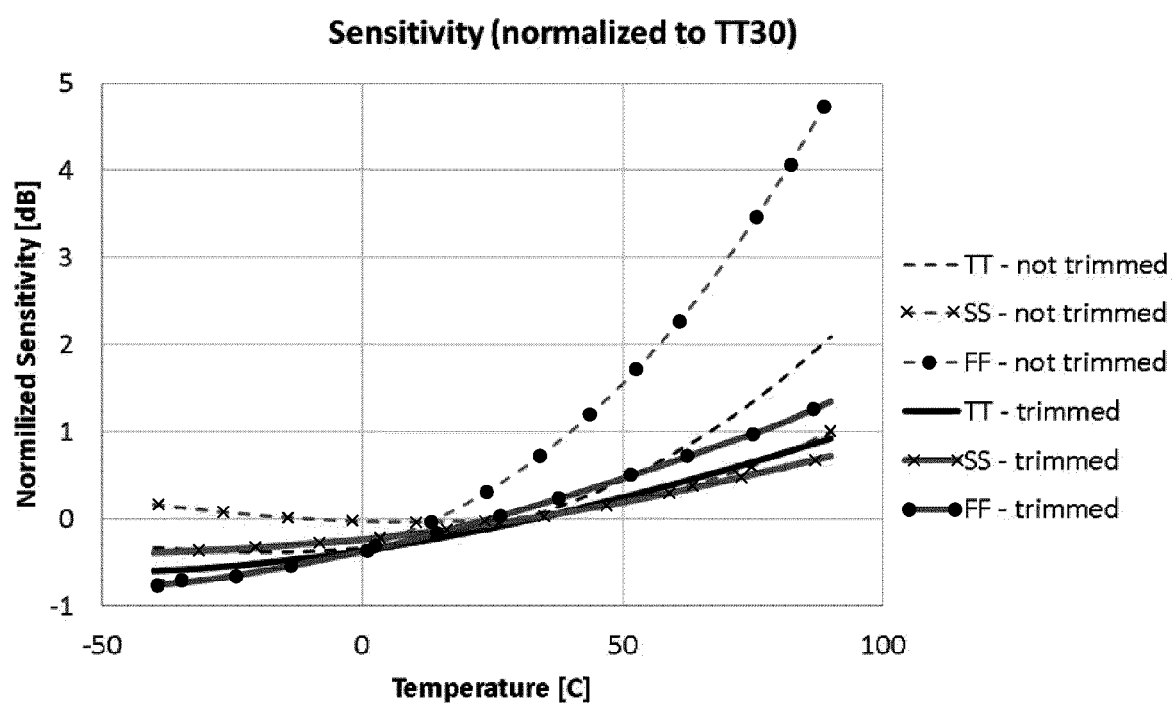

Effectively, to maximize the received power, $P_{in}$ 910 for short, it may be necessary but not yet enough condition to maximize the load power, i.e. the rectifier output power, $P_{out}$ 920 for short, and in order to maximize the load power it may be necessary to maximize also the rectifier efficiency, eff 105 for short, see FIG. 2.

The relation between the power available at the antenna, $P_{avail}$ 930 for short, and the load power, $P_{out}$ for short, being:

$$P_{out} = P_{avail} * \frac{eff}{ML}$$

where $\mathit{eff} = \dfrac{P_{out}}{P_{in}}$ and $ML = \dfrac{P_{avail}}{P_{in}}$ The mismatch loss, ML 905 for short, can be expressed in terms of the series impedances of antenna and tag as:

$$\frac{1}{ML} = \frac{4 R_a R_{ts}}{(R_a + R_{ts})^2 + (X_a + X_{ts})^2}$$

Where the antenna series impedance may be $Z_a = R_a + jX_a$ and the tag series impedance may be $Z_{ts} = R_{ts} + jX_{ts}$.

The ML may be minimized, i.e. ML=1, at conjugate matching. In others words, when $R_a = R_{ts}$ and $X_a = X_{ts}$.

The following «match» parameter may be used hereafter to quantify the load power for a given available power:

$$\frac{\mathit{eff}}{ML} = \mathit{eff} * \frac{4 R_a R_{ts}}{(R_a + R_{ts})^2 + (X_a + X_{ts})^2} = \frac{P_{out}}{P_{avail}} \text{ with } 0 \le \frac{\mathit{eff}}{ML} \le 1$$

In a RFID tag front-end the input equivalent circuit may be a parallel of a resistance, $R_{tp}$ 904 for short, and a capacitance, $C_{tp}$ 903 for short.

The input parallel resistance may be defined by the rectifier input parallel resistance.

At the frequency $f_0$ the parallel equivalent circuit can be represented by the equivalent series circuit, $R_{ts}$ 907 and $C_{ts}$ 906, according to the transformation formulas:

$$R_{ts} = \frac{R_{tp}}{1 + Q^2}$$

$$C_{ts} = C_{tp} \frac{1 + Q^2}{Q^2}$$

$$Q = 2\pi f_0 C_{tp} R_{tp}$$

Said open loop control unit 100, according to the present invention, may determine the rectifier output power $P_{out}$ and adjust the match parameter thus in turn controlling the rectifier input resistance $R_{tp}$ and efficiency eff. The match parameter may be a function of ML, i.e. function of $R_{ts}$ and $R_{tp}$, and eff.

The control on the rectifier input resistance and efficiency may be based on charge pump topology, as described in EP19207239, in particular, the applicant hereby incorporate p.5, l.24-p7, l.30, p.8, l.3-p.9, l.17, p.9, l.20-p.10, l.2 and p.11, l.1-24 by reference to EP19207239.

More precisely, the control on the rectifier input resistance and efficiency may act on a gate controller 200, 300 of a charge pump converter 500.

Figure 1B:
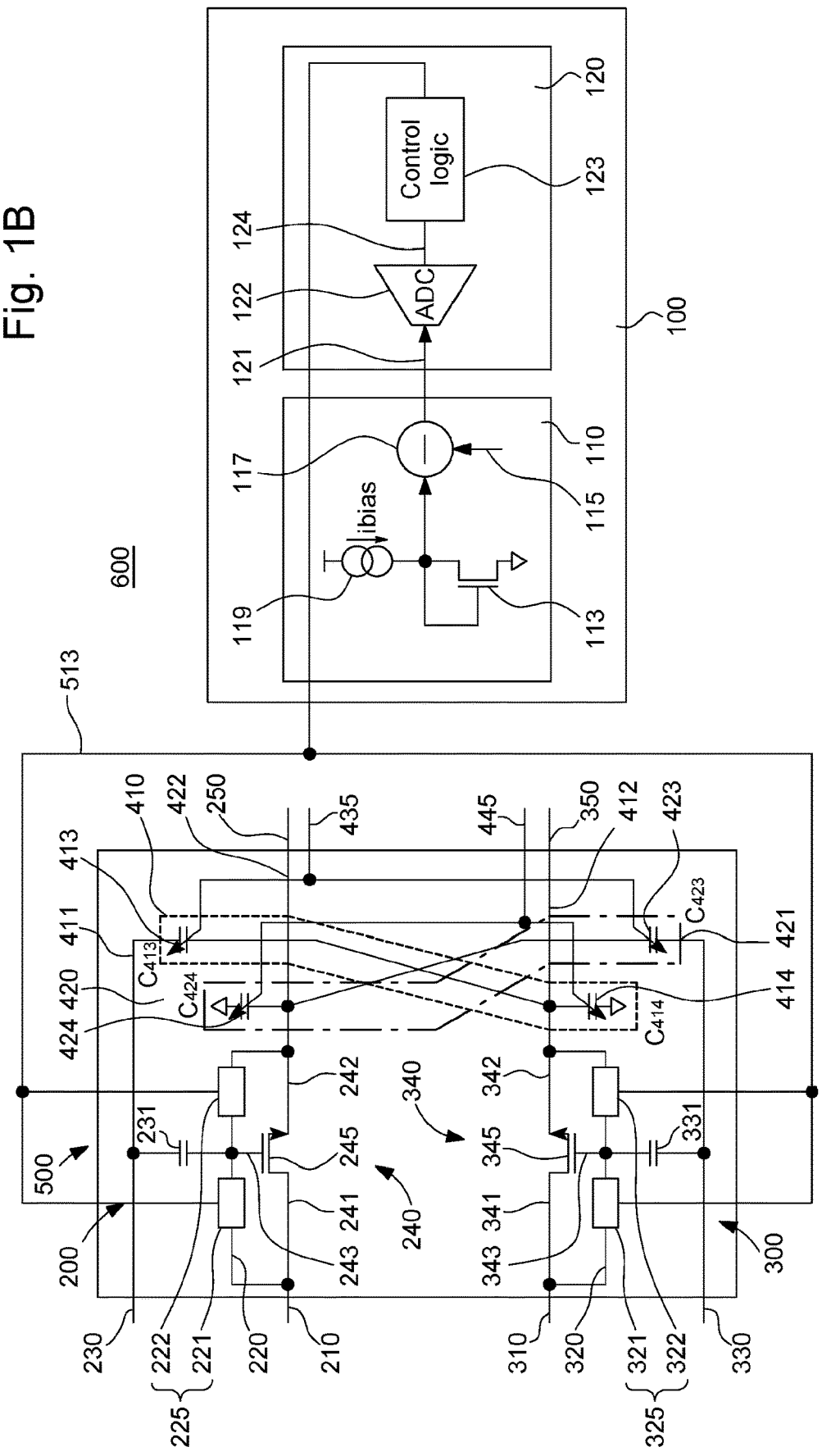

Said charge pump converter 500 may have an input impedance between a first input terminal 210 and a second input terminal 310, and a first output terminal 250, a second output terminal 350, a primary bias current flow controller 225, a secondary bias current flow controller 325, a primary attenuator controlling terminal 435 and a secondary attenuator controlling terminal 445, as illustrated in FIGS. 1A and 1B.

Said primary bias current flow controller 225 and said secondary bias current flow controller 325 may be configured to be plugged to said power control unit 100 and to modify input impedance, and said primary attenuator controlling terminal 435 and said secondary attenuator controlling terminal 445 may be configured to be plugged to said power control unit 100 and to modify a K-factor.

Effectively, to maximize the received power, $P_{in}$ 910 for short, may be a necessary but not yet enough condition to maximize the load power, i.e. the rectifier output power, $P_{out}$ 920 for short, and in order to maximize the load power it may be necessary to maximize also the rectifier efficiency, eff 105 for short, and the K-factor, also known as Q-factor.

The relation between the power available at the antenna, $P_{avail}$ 930 for short, and the load power, $P_{out}$ for short, being:

$$P_{out} = P_{avail} * \frac{\mathit{eff}}{ML}$$

where $\mathit{eff} = \dfrac{P_{out}}{P_{in}}$ and $ML = \dfrac{P_{avail}}{P_{in}}$ The mismatch loss, ML 905 for short, can be expressed in terms of the series impedances of antenna and tag as:

$$\frac{1}{ML} = \frac{4 R_a R_{ts}}{(R_a + R_{ts})^2 + (X_a + X_{ts})^2}$$

Where the antenna series impedance may be $Z_a = R_a + jX_a$ and the tag series impedance may be $Z_{ts} = R_{ts} + jX_{ts}$.

The ML may be minimized, i.e. ML=1, at conjugate matching. In others words, when $R_a = R_{ts}$ and $X_a = X_{ts}$.

The following «match» parameter may be used hereafter to quantify the load power for a given available power:

$$\frac{\mathit{eff}}{ML} = \mathit{eff} * \frac{4 R_a R_{ts}}{(R_a + R_{ts})^2 + (X_a + X_{ts})^2} = \frac{P_{out}}{P_{avail}} \text{ with } 0 \le \frac{\mathit{eff}}{ML} \le 1$$

In a RFID tag front-end the input equivalent circuit may be a parallel of a resistance, $R_{tp}$ 904 for short, and a capacitance, $C_{tp}$ 903 for short.

The input parallel resistance may be defined by the rectifier input parallel resistance.

At the frequency $f_0$ the parallel equivalent circuit can be represented by the equivalent series circuit, $R_{ts}$ 907 and $C_{ts}$ 906, according to the transformation formulas:

$$R_{ts} = \frac{R_{tp}}{1 + Q^2}$$

$$C_{ts} = C_{tp} \frac{1 + Q^2}{Q^2}$$

$$Q = 2\pi f_0 C_{tp} R_{tp}$$

Said power control unit 100, according to the present invention, may sense the rectifier output power $P_{out}$ and controls the match parameter thus in turn controlling the rectifier input resistance $R_{tp}$ and efficiency eff. The match parameter may be a function of ML, i.e. function of $R_{ts}$ and $R_{tp}$, and eff.

The control on the rectifier input resistance and efficiency may be based on charge pump converter topology, as described in EP19207239, in particular, the applicant hereby incorporate p.5, l.24-p7, l.30, p.8, l.3-p.9, l.17, p.9, l.20-p.10, l.2 and p.11, l.1-24 by reference to EP19207239.

More precisely, the control on the rectifier input resistance and efficiency may act on said primary bias current flow controller 225 and said secondary bias current flow controller 325, and said primary attenuator controlling terminal 435 and said secondary attenuator controlling terminal 445 respectively of said charge pump converter 500.

Said charge pump converter 500 may comprise at least one primary gate controller 200 and at least one secondary gate controller 300 as depicted in FIGS. 1A and 1B. Said at least one primary gate controller 200 may comprise at least one primary signal output 250, at least one first primary signal input 230, at least one primary bias input 220 and at least one second primary signal input 210.

Said at least one primary signal output 250 may be connected in series to a first circuit and/or an at least one second primary signal input 210 of a charge pump converter 500. Indeed, said at least one second primary signal input 210 may be connected to, preferably directly connected to an at least one primary signal output 250 of a following charge pump converter 500 and/or to receive a main signal, preferably from an antenna, from an integrated circuit and/or from a charge pump converter 500, and said at least one first primary signal input 230 may receive a first control signal and said at least one primary bias input 220 may establish a voltage value and/or a current value of said at least one primary gate controller 200.

Further, said at least one primary gate controller 200 may comprise at least one primary switching element 240 having a primary conduction path 245 with a first primary terminal 241 and a second primary terminal 242, and a primary gate 243 configured to control the current flowing through said primary conduction path 245: said primary conduction path 245 may provide said at least one primary signal. By controlling, the skilled man in the art would understand that the current flowing through said primary conduction path 245 or said secondary conduction path 345 may be varied in amplitude, frequency, and/or in phase such as to be transmitted to another charge pump converter stage for instance as shown in FIG. 1.

Said primary gate 243 may be also connected to, preferably directly connected to said at least one first primary signal input 230 preferably via at least one primary coupling capacitor 231 and to said at least one primary bias input 220 via at least one primary bias element 221, like at least one first primary bias current flow controller 221. So, the charge pump converter stage allows adjusting the bias voltage of said primary gate 243 by coupling said primary gate 243 of the switching element to the output of the previous charge pump converter stage and/or said at least one bias input, which sets the DC gate's voltage reference bias.

Similarly to said at least one primary gate controller 200, said at least one secondary gate controller 300 may comprise at least one secondary signal output 350, at least one first secondary signal input 330, at least one secondary bias input 320 and at least one second secondary signal input 310. Said secondary gate 343 may be also connected to, preferably directly connected to said at least one first secondary signal input 330 preferably via at least one secondary coupling capacitor 331 and to said at least one secondary bias input 320 via at least one secondary bias element 321, like at least one first secondary bias current flow controller 321.

Said at least one secondary signal output 350 may be connected in series to a second circuit an at least one second secondary signal input 310 of a charge pump converter 500. Indeed, said at least one second secondary signal input 310 may be connected to, preferably directly connected to an at least one secondary signal output 350 of a following charge pump converter 500 and/or to receive said main signal, preferably from an antenna, from an integrated circuit and/or from a charge pump converter 500, and said at least one first secondary signal input 330 may receive a second control signal, and said at least one secondary bias input 320 may establish a voltage value and/or a current value of said at least one secondary gate controller 300. As shown in FIG. 1B, said at least one first primary signal input 230 may be connected to, preferably directly connected to said at least one primary signal output 250 and said at least one first secondary signal input 330 may be connected to, preferably directly connected to said at least one secondary signal output 350.

Further, said at least one secondary gate controller 300 may comprise at least one secondary switching element 340 having a secondary conduction path 345 with a first secondary terminal 341 and a second secondary terminal 342, and a secondary gate 343 configured to control the current flowing through said secondary conduction path 345: said secondary conduction path 345 may provide said at least one secondary signal.

Said secondary gate 343 may be also configured to be connected to, preferably directly connected to said at least one first secondary signal input 330, via at least one secondary coupling capacitor 331, and to said at least one secondary bias input 320. So, the charge pump converter stage allows adjusting the bias voltage of said secondary gate 343 by coupling the said secondary gate 343 of the switching element to the output of the previous charge pump converter stage and said at least one bias input, which sets the DC gate's voltage reference bias.

In order to adjust the bias voltage of the gates 243, 343, the gates 243, 343 of the switching elements in said at least one primary gate controller 200 and said at least one secondary gate controller 300 may be coupled to the output of the previous charge pump converter stage and/or said at least one bias input 220, 320, which sets the DC gate's voltage reference bias. More specifically, the present invention may comprise said at least one primary gate controller 200 and said at least one secondary gate controller 300 having said primary gate 243, said at least one primary bias input 220 connected to, preferably directly connected to said primary gate 243 through a bias element like a resistor or a transistor and said secondary gate 343, said at least one secondary bias input 320 connected to, preferably directly connected to said secondary gate 343 through at least one primary bias element 221 and/or at least one secondary bias element 321 like a resistor or a transistor respectively such as to control the DC voltage bias of said primary gate 243 and said secondary gate 343 and therefore the conductivity of at least one primary switching element 240 and at least one secondary switching element 340 respectively. Said bias inputs, more precisely said at least one primary bias input 220 and said at least one secondary bias input 320 may be properly connected to, preferably directly connected to internal nodes of said charge pump converter 500 such that said at least one primary gate controller 200 and said at least one secondary gate controller 300 may be self-biased without using bias-reference external to the charge pump. As it may be in FIG. 1B, where said at least one primary bias input 220 may be directly connected to, preferably directly connected to said at least one second primary signal input 210, and said at least one secondary bias input 320 may be directly connected to, preferably directly connected to said at least one second secondary signal input 310.

As previously mentioned, said bias element may be a resistor or a transistor. Indeed, said at least one primary bias input 220 may comprise at least one first primary bias current flow controller 221, like at least one first primary bias transistor 221. In some embodiments, said primary gate 243 may be connected to, preferably directly connected to said second primary terminal 242, rather said at least one primary signal output 250 via an at least one second primary bias current flow controller 222 and/or at least one second primary bias transistor thus the primary conduction path 245 of the primary switching element 240 may be controlled. The same may apply for the secondary switching element 340 with at least one first secondary bias current flow controller 221, like at least one first secondary bias transistor 221 and at least one second secondary bias current flow controller 322 like at least one second secondary bias transistor.

The applicant does not exclude the gate voltage of said primary gate 243 may be determined by configuration of said at least one first primary bias current flow controller 221, like a resistor, and at least one second primary bias current flow controller 222, like a resistor, forming a resistive divider and the DC primary gate voltage may be comprised between the voltage value of said at least one second primary signal input 210 and of a second primary terminal 242. The same may apply for the secondary switching element 340.

According to some embodiments not represented, instead of a resistor as said at least one first primary bias current flow controller 221 and/or as said at least one second primary bias current flow controller 222, a transistor and preferably by a MOS transistor may be used such as the primary conduction path 245 of the primary switching element 240 may be controlled and may make said charge pump converter 500 programmable and more specifically said at least one primary gate controller 200 programmable. The same may apply for the secondary switching element 340.

Further, said at least one first primary bias transistor 221 may be trimmed, via at least one impedance controlling terminal 513, such as to control the current flowing through and/or said at least one first primary bias transistor 221 and/or wherein said at least one second primary bias transistor may be trimmed, via at least one impedance controlling terminal 513, such as to control the current flowing through said at least one first primary bias transistor 221. So, the primary conduction path 245 of the switching element 240 may be controlled which makes the charge pump converter programmable via an integrated circuit, a microcontroller and/or a processor. The same may apply for the secondary switching element 340.

As shown in FIGS. 1A and 1B, said at least one first primary bias transistor 221 and/or said at least one second primary bias transistor 222 may comprise at least one impedance controlling terminal 513 configured to trim the current flowing through said at least one first primary bias transistor 221 and/or said at least one second primary bias transistor 222 as aforementioned.

Thanks to the arrangements according to the invention, the conduction path of at least one primary switching element 240 and/or at least one secondary switching element 340 may be controlled which makes the charge pump converter programmable via said at least one open loop control unit 100 and more particularly via said first input impedance controlling terminal 513.

The same may apply for said at least one first secondary bias transistor and said at least one second secondary bias transistor.

The applicant may want to have a linear control of said charge pump converter 500 programmable and more specifically said at least one primary gate controller 200 programmable a potentiometer and/or the digital potentiometer may replace said transistor and preferably said MOS transistor in linear with a controlled channel resistance. Since the plurality of primary bias transistor and secondary bias transistor may comprise at least one first primary bias transistor 221 and/or at least one second primary bias transistor 222, the conduction path 245 of the primary switching element 240 may be linearly controlled and may make the charge pump converter programmable via said at least one open loop control unit 100. The same may apply for the secondary switching element 340.

Thus, for a given input power, by maximizing the output power in said charge pump converter 500 relatively constant over process and temperature variations for example, input resistance $R_{tp}$ and rectifier efficiency eff may be obtained.

It follows that said open loop control unit 100, by reducing the spread of the match parameter makes the Sensitivity and the reading distance tag performance more constant and reliable across temperature and process variations.

It also follows that said open loop control unit 100, by reducing the spread of the rectifier input resistance $R_{tp}$ makes the tag quality factor Q more constant over temperature and process variations enabling more consistent Sensitivity and tag reading distance performances across the UHF band.

At the resonance, i.e. when $X_a = -X_{ts}$, it may be possible that the equivalent series resistance at resonance $R_{ts}$ matches the antenna resistance $R_a$ minimizing the mismatch loss ML.

If the $P_{avail}$ may be the minimum input power at which the Tag can operate, then said open loop control unit 100 may minimize the tag Sensitivity and may maximize the tag reading distance over temperature and process variations.

Thus, using a PSBGC rectifier and said open loop control unit 100, it may be possible to perform an automatic control of the input resistance, via at least one impedance controlling terminal 513, and efficiency of the match parameter of the PSBGC rectifier.

In order to achieve this objective, said open loop control unit 100 may comprise at least one reference circuit 110, and at least one control unit 120.

Said at least reference circuit 110 may comprise at least one main reference 115 configured to be constant over time and temperature, and at least one auxiliary reference 113 configured to vary over time and temperature. Thus, said at least one reference circuit 110 may be configured to sense difference between said at least one main reference 115 and said at least one auxiliary reference 113 such as to transmit a difference value 121 as a function of the temperature and/or the time. According to an embodiment, said voltage difference value 121 and/or said current difference value 121 may be transmitted as analog signal to said at least one control unit 120, which may be quicker than digital signal.

Said at least one control unit 120 may be configured to receive said difference value 121, to establish a trim value and to send said trim value to said impedance controlling terminal 513 such as to modify said input impedance, by controlling in amplitude, frequency, and/or in phase the current flowing through said primary conduction path 245 or said secondary conduction path 345. Thus, said open loop control unit 100 may determine the received power and may take actions to minimize the tag sensitivity and thus may maximize the tag reading distance.

As depicted in FIG. 1, said reference circuit 110 may comprise said at least one main reference 115 and said at least one auxiliary reference 113. Said at least one auxiliary reference 113 may comprise at least one first switching element 113 having first specifications and said charge pump converter 500 may comprise at least one primary switching element 240 and at least one secondary switching element 340 having second specifications. By said first specifications and said second specifications, the skilled man in the art may understand the specification comprised in a datasheet of said at least one primary switching element 240, said at least one secondary switching element 340 and/or said at least one auxiliary reference 113 like average value of current and/or voltage, a typical value of current and/or voltage, a typical range of current and/or voltage, tolerances of current and/or voltage, and/or a nominal value of current and/or voltage for instance.

A ratio between said first specifications and said second specifications may be comprised between 0.8 and 1.25, preferably between 0.9 and 1.11. In others words, said at least one first switching element 113 may have more or less the same specifications than said at least one primary switching element 240 and at least one secondary switching element 340 such as to replicate the variation of said at least one primary switching element 240 and at least one secondary switching element 340 without using a feedback to determine said input impedance between a second primary signal input 210 and a second secondary signal input 310. Further, since said at least one first switching element 113 may have more or less the same specifications than said at least one primary switching element 240 and at least one secondary switching element 340, said at least one first switching element 113 may be likely to behave like said at least one primary switching element 240 and at least one secondary switching element 340 over time and/or temperature.

As depicted in FIGS. 1A and 1B, said at least one first switching element 113 may be a MOSFET transistor in a diode configuration and the drain of said at least one first switching element 113 may be connected to a bias current source 119. Thus, for a given bias current through said at least one first switching element 113, the forward bias voltage varies across temperature and process variations which may result in a variable value supplied by said at least one auxiliary reference 113. It may be shown that, for each process and temperature, by controlling the forward bias voltage of said at least one first switching element 113, the charge pump converter efficiency and input impedance may spread significantly less across temperature and process variations.

Said at least one first switching element 113 may also be connected to said at least one main reference 115. As aforementioned, said at least one main reference 115 may be constant over time and temperature and may set a reference value. Said at least one reference circuit 110 may comprise at least one at least one comparison circuit 117 connected to said at least one main reference 115 and said at least one auxiliary reference 113 such as to compare said reference value to said variable value.

Said difference between said at least one main reference 115 and said at least one auxiliary reference 113 may be transmitted as a difference value 121 as a function of the temperature and/or the time.

In other words, the variation over time and temperature of charge pump converter 500 may be determined with said at least one reference circuit 110. During the adaptation of the impedance, said at least one main reference 115 may be set such that said output value of said charge pump converter 500 may be slightly above the power-on-reset or POR value.

The analog output of said at least reference circuit 110 carries the information of the charge pump converter 500 output power, which may be converted to a digital word by said at least control unit 120, and more specifically by at least one converter 122. The latter, i.e. said at least one converter 122, may be configured to convert said sensed current value and/or said sensed voltage value of said charge pump converter 500 into a digital voltage value 124 and/or a digital current value 124, in other word, a copy of said difference value 121 may be converted to a digital word 124 by said at least one converter 122.

Said at least control unit 120, previously mentioned, may comprise at least one controller 123 configured to establish an established voltage value and/or an established current value as a function of said sensed current value and/or said sensed voltage value of said charge pump converter 500, such as to find the best trim code to maximize Pout_d.

Thus, thanks to this arrangement, said open loop control unit 100 may reduce the spread of at least Input Resistance, Mismatch Loss, Quality Factor, Rectifier Efficiency and/or Match parameter over temperature and process variations.

In addition to the above advantage, if said charge pump converter 500, which may be a rectifier, may be designed such that the tag input resistance matches the antenna resistance at the minimum input power at which the tag can operate, the Tag Sensitivity may be minimized and/or the Tag reading distance may be maximized over temperature and process variations.

FIGS. 4A-4G represent Tag input parallel resistance $R_{tp}$, input equivalent series resistance $R_{ts}$, Tag mismatch loss ML and Tag Quality Factor Q respectively, for a given input power as a function of temperature and over three process corners for a tag using an 8-stages differential Dickson charge pump with rectifier and with said open loop control unit 100. In the not trimmed case the trim code to the rectifier may be kept fixed. In the trimmed case the trim code to the rectifier may be determined by said open loop control unit 100 control loop.

Figure 5:
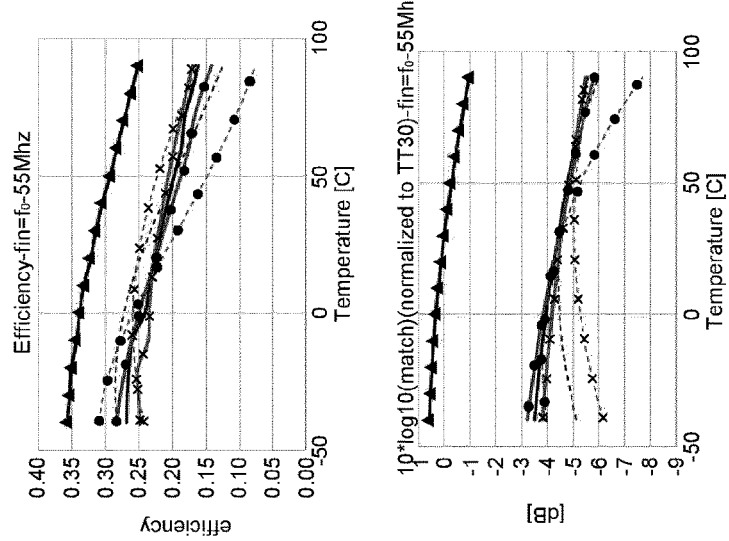
FIG. 5 represents a AutoMatch tag performances at $f_{in}=f_0-55$ MHz.

The AutoMatch tag performances may be here evaluated for a given input power at $f_{in}=f_0-55$ MHz, see FIG. 5, with a series resonant RLC antenna-tag equivalent circuit tuned at $f_0$ and with an antenna quality factor equals to 16. In all the plots the performances out of resonance may be compared with the TT-trimmed case at $f_{in}=f_0$. The «match» parameter may be maximized in all the conditions even with an input frequency out of resonance $X_a \neq X_{ts}$.

Figure 6:
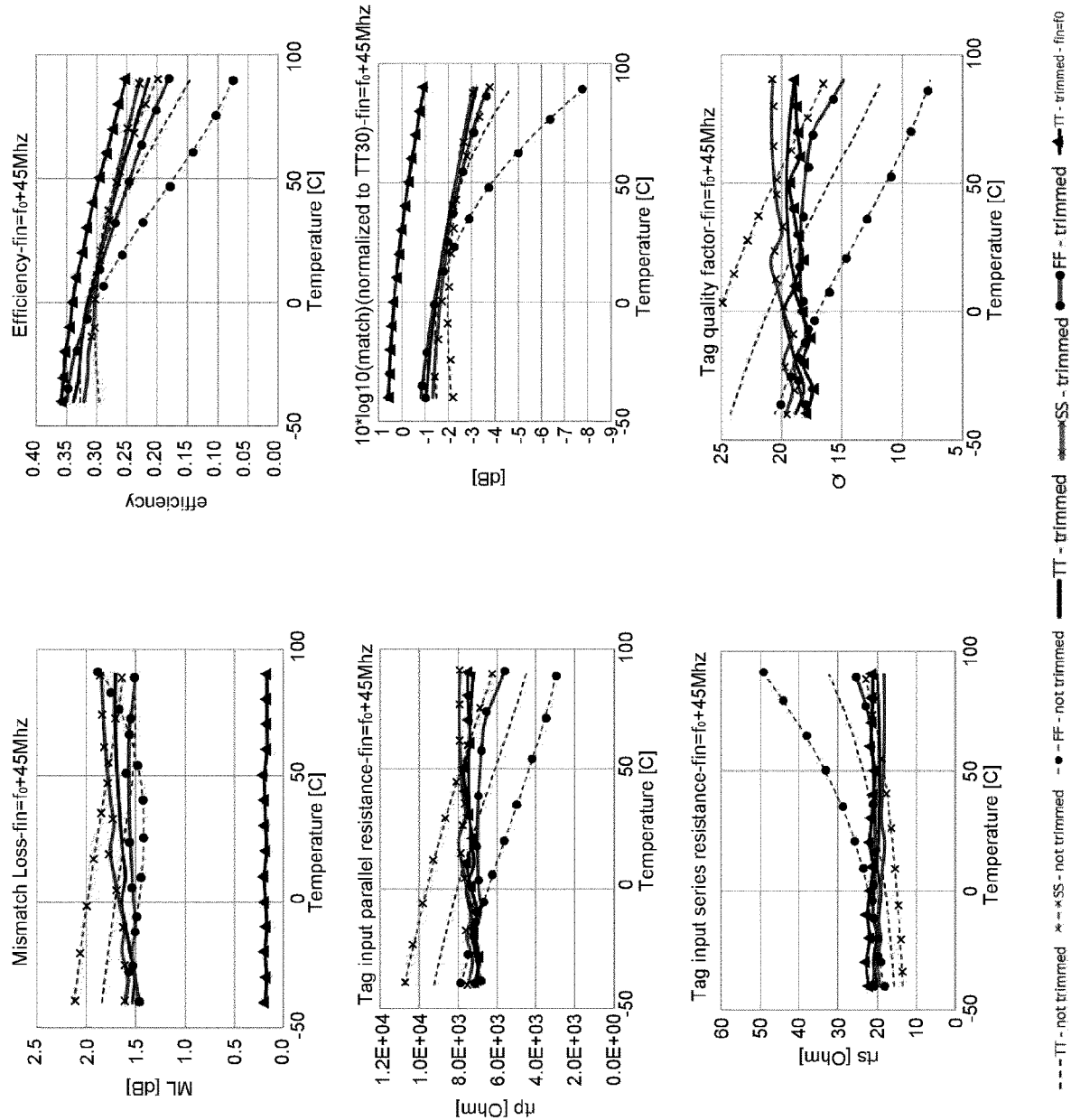
FIG. 6 illustrates a AutoMatch tag performances at $f_{in}=f_0+45$ MHz.
Figure 7:
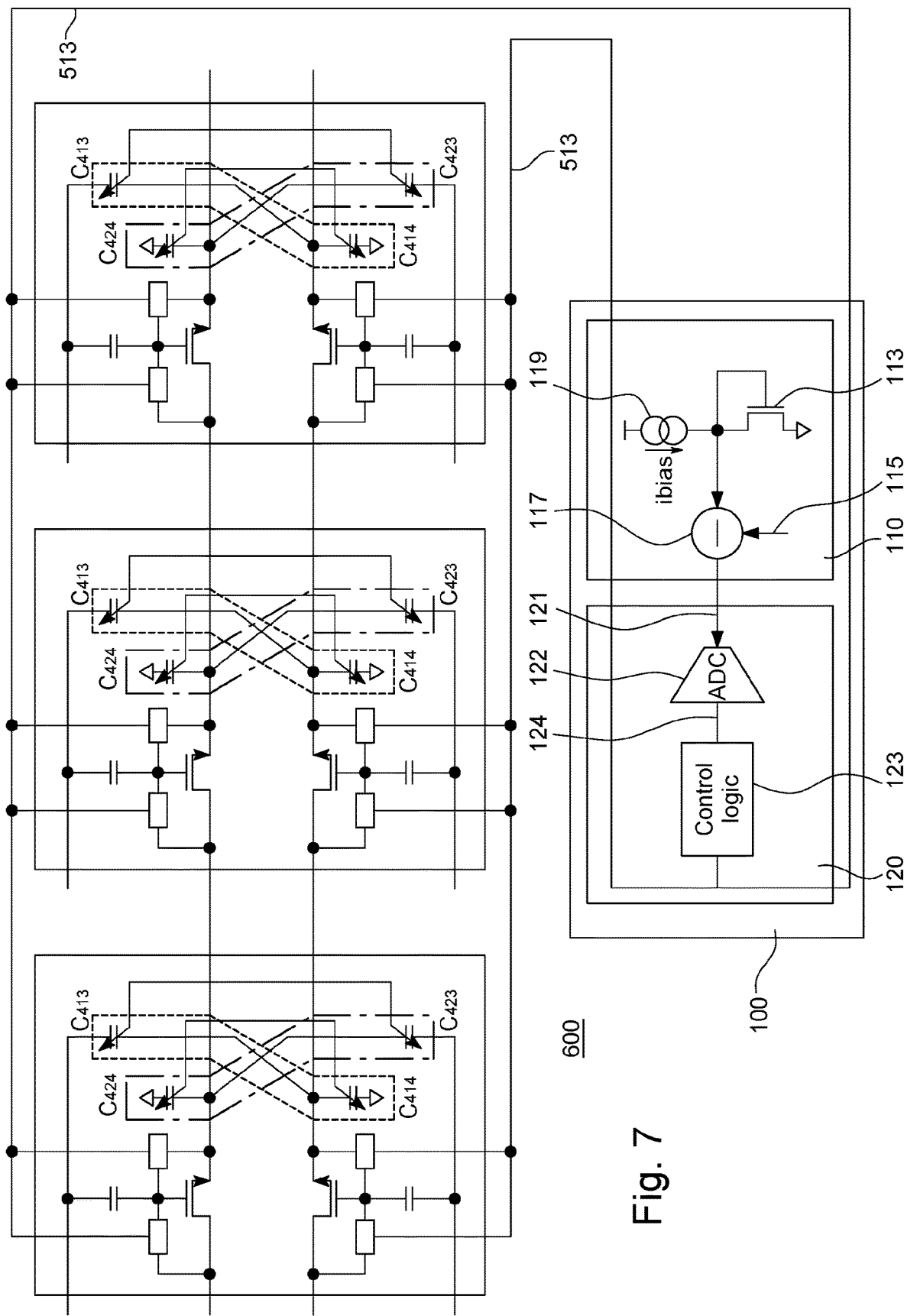
FIG. 7 represents a control system device 600 comprising a plurality of charge pump converters 500 and at least one power control unit 100 according to the invention.

In FIG. 6, the AutoMatch tag performances may be evaluated for a given input power at $f_{in}=f_0+45$ MHz with a series resonant RLC antenna-tag equivalent circuit tuned at f0 and with an antenna quality factor equals to 16. In all the plots the performances out of resonance may be compared with the TT-trimmed case at $f_{in}=f_0$. The «match» parameter may be maximized in all the conditions even with an input frequency out of resonance $X_a \neq X_{ts}$.

The invention claimed is:

1. An open loop control unit configured to control an efficiency and/or an input impedance of a charge pump converter having an input impedance between a second primary signal input and a second secondary signal input, and a first input impedance controlling terminal configured to be plugged to said open loop control unit, said first input impedance controlling terminal being configured to modify said input impedance, said open loop control unit comprising:

a reference circuit comprising at least one main reference configured to be constant over time and temperature, and at least one auxiliary reference configured to vary over time and temperature, said at least one reference circuit being configured to sense a difference between said at least one main reference and said at least one auxiliary reference so as to transmit a difference value as a function of the temperature and/or the time; and a control circuit configured to receive said difference value, to establish a trim value, and send said trim value to said impedance controlling terminal so as to modify said input impedance.

2. The open loop control unit according to claim 1, wherein said difference value comprises a voltage difference value and/or a current difference value.

3. The open loop control unit according to claim 1, wherein said at least one auxiliary reference comprises at least one first switching element having first specifications, and said charge pump converter comprises at least one primary switching element, and/or at least one secondary switching element having second specifications, a ratio between said first specifications and said second specifications being between 0.8 and 1.25.

4. The open loop control unit according to claim 3, wherein said first specifications and said second specifications vary over time and temperature.

5. The open loop control unit according to claim 1, wherein said at least one main reference is configured to set a reference value, and said at least one auxiliary reference is configured to supply a variable value, said reference value being constant over time and temperature, and said variable value varying over time and temperature.

6. The open loop control unit according to claim 5, wherein said at least one reference circuit comprises at least one comparison circuit configured to compare said reference value to said variable value.

7. The open loop control unit according to claim 1, wherein said control circuit comprises at least one controller configured to establish an established voltage value and/or an established current value as a function of said difference between said at least one main reference and said at least one auxiliary reference.

8. The open loop control unit according to claim 1, further comprising a bias supplier comprising at least one converter configured to convert said difference between said at least one main reference and said at least one auxiliary reference into a digital voltage value and/or a digital current value.

9. A control system device comprising at least one open loop control unit according to claim 1 and the charge pump converter, said charge pump converter comprising at least one primary gate controller and at least one secondary gate controller, said at least one primary gate controller comprising at least one of a primary signal output configured to be connected to an at least one second primary signal input of a charge pump converter stage and/or a first circuit;

a first primary signal input configured to receive a first control signal;

a primary bias input configured to establish a voltage value and/or a current value of said at least one primary gate controller;

a second primary signal input configured to be connected to an at least one primary signal output of a charge pump converter stage and/or to receive said main signal from an integrated circuit, at least one primary signal, and/or from a charge pump converter stage; and said at least one secondary gate controller comprises at least one of:

a secondary signal output configured to be connected to an at least one second secondary signal input of a charge pump converter stage and/or a second circuit;

a first secondary signal input configured to receive a second control signal;

a secondary bias input configured to establish a voltage value and/or a current value of said at least one secondary gate controller; and a second secondary signal input configured to be connected to an at least one secondary signal output of a charge pump converter stage and/or receive a main signal from an integrated circuit, at least one secondary signal, and/or from a charge pump converter stage, said at least one first primary signal input being configured to be connected to said at least one secondary signal output, and said at least one first secondary signal input being configured to be connected to said at least one primary signal output.

10. The control system device according to claim 9, wherein said at least one primary gate controller comprises at least one primary switching element having a primary conduction path with a first primary terminal and a second primary terminal, and a primary gate configured to control the current flowing through said primary conduction path, said primary conduction path being configured to provide said at least one primary signal, wherein said primary gate is configured to be connected to said at least one first primary signal input and to said at least one primary bias input, and/or wherein said at least one secondary gate controller comprises at least one secondary switching element having a secondary conduction path with a first secondary terminal and a second secondary terminal, and a secondary gate configured to control the current flowing through said secondary conduction path, said secondary conduction path being configured to provide said at least one secondary signal, said secondary gate being configured to be connected to said at least one first secondary signal input and to said at least one secondary bias input.

11. The control system device according to claim 9, wherein said at least one primary bias input comprises a plurality of primary bias current flow controllers comprising at least one first primary bias current flow controller and/or at least one second primary bias transistor, and/or wherein said at least one secondary bias input comprises a plurality of secondary bias current flow controllers comprising at least one first secondary bias current flow controller and/or at least one second secondary bias transistor.

12. The control system device according to claim 9, wherein said charge pump converter comprises at least one first input impedance controlling terminal configured to be plugged to said open loop control unit so as to modify said input impedance.

13. The control system device according to claim 11, wherein said at least one first input impedance controlling terminal is configured to control the current flowing through said primary conduction path or said secondary conduction path and of said at least one first primary bias current flow controller said at least one second primary bias transistor, said at least one first secondary bias current flow controller and/or said at least one second secondary bias transistor.

* * * * *